(12) United States Patent
Malone

(10) Patent No.: US 8,618,426 B2
(45) Date of Patent: Dec. 31, 2013

(54) MOBILE SOUND AND LIGHT RESISTANT ELECTROMAGNETIC ISOLATION CHAMBER

(76) Inventor: William Gerard Malone, Cumming, GA (US)

(*) Notice: Subject to any disclaimer, the term of this patent is extended or adjusted under 35 U.S.C. 154(b) by 134 days.

(21) Appl. No.: 13/328,837

(22) Filed: Dec. 16, 2011

(65) Prior Publication Data

US 2012/0085576 A1     Apr. 12, 2012

Related U.S. Application Data

(62) Division of application No. 12/138,785, filed on Jun. 13, 2008, now Pat. No. 8,101,872.

(60) Provisional application No. 60/943,571, filed on Jun. 13, 2007.

(51) Int. Cl.
    *H05K 9/00*     (2006.01)

(52) U.S. Cl.
    USPC ........ 174/382; 174/386; 206/719; 340/572.8; 455/575.8

(58) Field of Classification Search
    USPC .................. 206/719, 721; 174/377, 382, 386; 340/572.8; 455/575.8
    See application file for complete search history.

(56) References Cited

U.S. PATENT DOCUMENTS

| | | | |
|---|---|---|---|
| 4,308,953 A | 1/1982 | Cohen | |
| 4,331,285 A | 5/1982 | Gottwals | |
| 4,471,872 A | 9/1984 | Dedow | |
| 4,496,406 A | 1/1985 | Dedow | |
| 4,531,609 A | 7/1985 | Wolf et al. | |
| 4,647,714 A | 3/1987 | Goto | |
| 4,658,958 A | 4/1987 | McNulty | |
| 4,684,020 A | 8/1987 | Ohibach | |
| 4,706,438 A | 11/1987 | Ohibach | |
| 5,090,563 A | 2/1992 | Becker | |
| 5,129,519 A | 7/1992 | David et al. | |
| 5,255,785 A | 10/1993 | Mackey | |
| 5,336,896 A | 8/1994 | Katz | |
| 5,581,047 A | 12/1996 | Lazaroff | |
| 5,594,200 A | 1/1997 | Ramsey | |
| 5,651,171 A | 7/1997 | Nelson | |
| 5,777,261 A | 7/1998 | Katz | |
| 6,593,524 B1 | 7/2003 | Toedtman | |
| 6,657,214 B1 * | 12/2003 | Foegelle et al. | ............ 250/506.1 |
| 7,753,979 B2 | 7/2010 | Amann | |
| 8,412,123 B2 * | 4/2013 | Foster | .......................... 455/90.3 |
| 2002/0074142 A1 | 6/2002 | Katz | |

(Continued)

FOREIGN PATENT DOCUMENTS

EP     0223650     12/2011

OTHER PUBLICATIONS

Office Action issued in U.S. Appl. No. 10/246,738 issued Apr. 9, 2004.

(Continued)

*Primary Examiner* — Hung Ngo
(74) *Attorney, Agent, or Firm* — FisherBroyles, LLP; Anthony J. DoVale

(57) ABSTRACT

A device enclosing a volume shielded from certain levels of sound, light and electromagnetic radiation, such device that prevents electromagnetic communications and recording devices from transmitting and receiving communications from outside of the devices protected environment while remaining mobile and ungrounded.

20 Claims, 17 Drawing Sheets

(56) References Cited

U.S. PATENT DOCUMENTS

| | | |
|---|---|---|
| 2002/0137475 A1* | 9/2002 | Shou et al. .................... 455/90 |
| 2003/0057131 A1 | 3/2003 | Diaferia |
| 2005/0030707 A1* | 2/2005 | Richardson et al. .......... 361/681 |
| 2005/0130722 A1* | 6/2005 | Eriksson et al. ........... 455/575.8 |
| 2006/0232491 A1* | 10/2006 | Nakamura .................... 343/841 |
| 2007/0259704 A1* | 11/2007 | Jung .......................... 455/575.8 |

OTHER PUBLICATIONS

Metal Textiles, EMI/RFI Shielding Electromagnetic Shielding Theory, http://www.metexcorp.com/emirfi_theory.thm.
Office Action issued in U.S. Appl. No. 12/138,785 on Oct. 14, 2010.
Office Action issued in U.S. Appl. No. 12/138,785 on Mar. 23, 2011.
Notice of Allowance issued in U.S. Appl. No. 12/138,785 on Sep. 28, 2011.

* cited by examiner

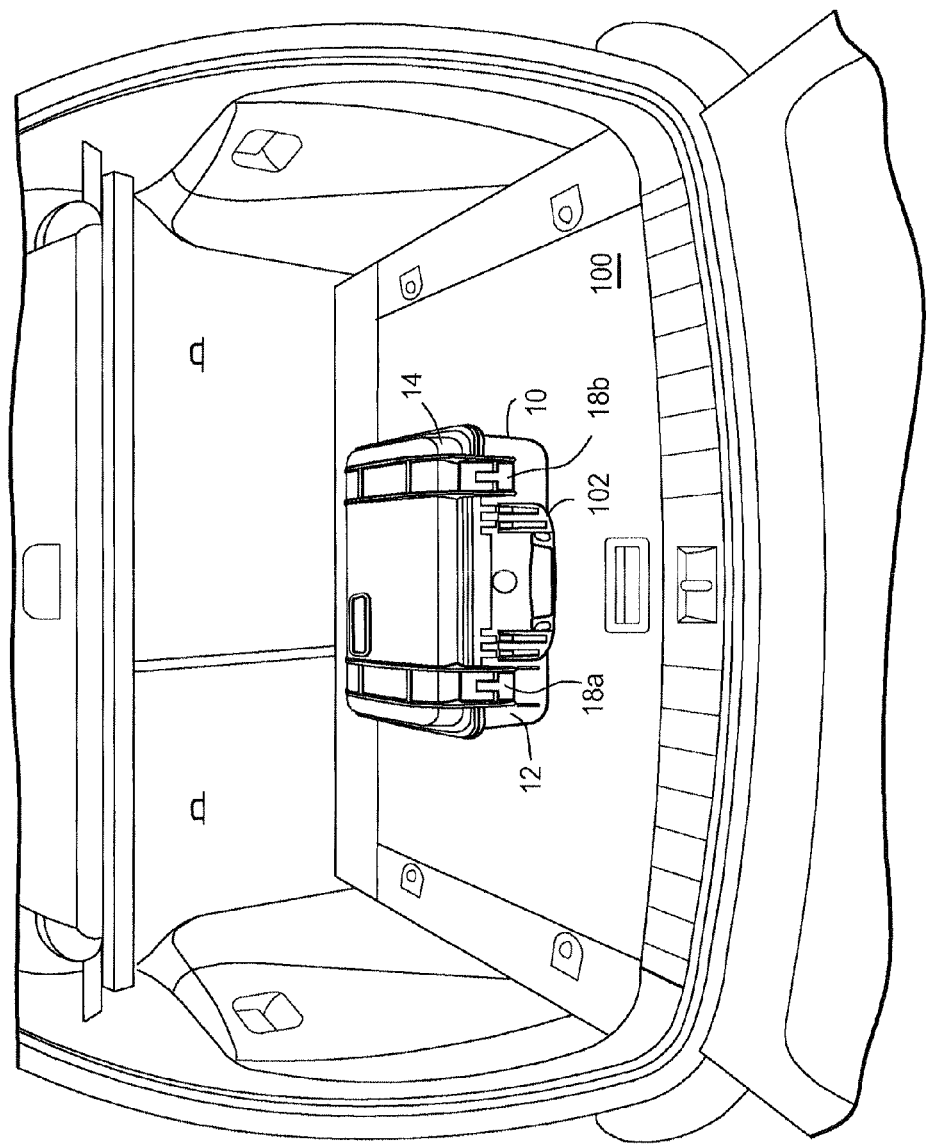

MOBILE SOUND AND LIGHT RESISTANT ELECTROMAGNETIC ISOLATION CHAMBER

CROSS-REFERENCES TO RELATED APPLICATIONS

This Application is a divisional of U.S. application Ser. No. 12/138,785, filed Jun. 13, 2008, which claims the benefit of Provisional Application No. 60/943,571 filed Jun. 13, 2007, the contents of which are incorporated herein by reference.

STATEMENT REGARDING FEDERALLY SPONSORED RESEARCH OR DEVELOPMENT

N/A

FIELD

The technology herein relates to isolation chambers, particularly to chambers for isolating electromagnetic transmitting or receiving devices, and more particularly to such a chamber that is portable, ungrounded, and/or contains a system to reduce the introduction of sound and light into the protected environment.

BACKGROUND AND SUMMARY

Electromagnetic reception and/or transmission is an important function of many devices such as for example, Cellular telephones, Personal Communications Systems (PCS) devices, Specialized Mobile Radios (SMR), Personal Digital Assistants, small computing devices with radio modems, Radio location devices, and the like. In addition, sound and light are important in the function of the sound and image recording capabilities of these devices i.e. digital camera functions, digital video image recording functions, sound/voice recording capabilities and the like. Commonly, when it is necessary to electromagnetically isolate such devices, the device or devices to be isolated are placed inside an enclosed space and a gasketed lid is securely latched thus creating a electromagnetic isolation (EMI) chamber. Such chambers are also known as "Faraday cages," and may comprise a continuous shielding enclosure which prevents the ingress or egress of electromagnetic radiation.

Typically these types of chambers are used to isolate a single device for the purposes of testing, tuning and the repair of such devices. These devices can require that the device under test (DUT) be isolated from ambient electromagnetic radiation. Such a chamber may take the form of an entire room, known in the art as a "screen room" for its continuous screen shielding, or in the form of smaller shielded enclosures.

These enclosures are generally designed for devices under test, not necessarily for isolating active RF devices for security and privacy reasons. A shortcoming of at least some known shielding boxes is a lack of provision for the reduction of ambient sound and light, ungrounded operation and mobility.

The technology herein provides in one exemplary illustrative implementation, a portable ungrounded device capable of isolating such communication and recording devices. It is sometimes necessary to isolate such devices from transmitting or receiving any signals, communications and the such from outside of the protected space, thus containing or preventing the unwanted ingress and egress of information, data, images and the such from these devices to areas and or parties outside of the protected space, while remaining mobile and ungrounded.

Briefly described, the exemplary illustrative non-limiting apparatus comprises a box enclosing a volume which is fully shielded from electromagnetic radiation, shielded from sound and light for handling devices requiring electromagnetic isolation for reasons of security, privacy and the like. An exemplary illustrative non-limiting shielded enclosure comprises a structure having radio frequency (RF) shielding on or embedded in all sides or walls of the structure so that substantially no net electromagnetic radiation is transmitted either into or out of the structure. The structure is capable of providing attenuation (signal reduction) levels sufficient to render the device to be isolated inoperable and isolated to a degree that prevents the device from transmitting or receiving electromagnetic transmissions, signals, information, data, images, and the such from outside the protected space. The structure is openable, preferably by having a lid hinged from the body and securable by a latch or accessible or by other methods such as sliding lids, magnetic lids, swing out lids and the like, there being appropriately shielded by radio frequency gasketing between the lid and the body of the structure.

Additionally a sound resistant lining or barrier provides protection from the introduction of sound from outside of the chamber to recording devices inside the chamber. The structure may have a handle, handles and/or strap points in order to add to the mobility and usability of the device.

Secondary shielding may add ambient sound shielding and additional protection from ambient light. The chamber may also rely on the function of a Radio Frequency Absorbing Foam (RFAF) lining, and sound and light proof materials.

BRIEF DESCRIPTION OF THE DRAWINGS

These and other features and advantages will be better and more completely understood by referring to the following detailed description of exemplary non-limiting illustrative embodiments in conjunction with the drawings of which:

FIGS. 12A-12C show an exemplary isolation chamber implementation providing a small suitcase form factor;

DETAILED DESCRIPTION

Figure 1:
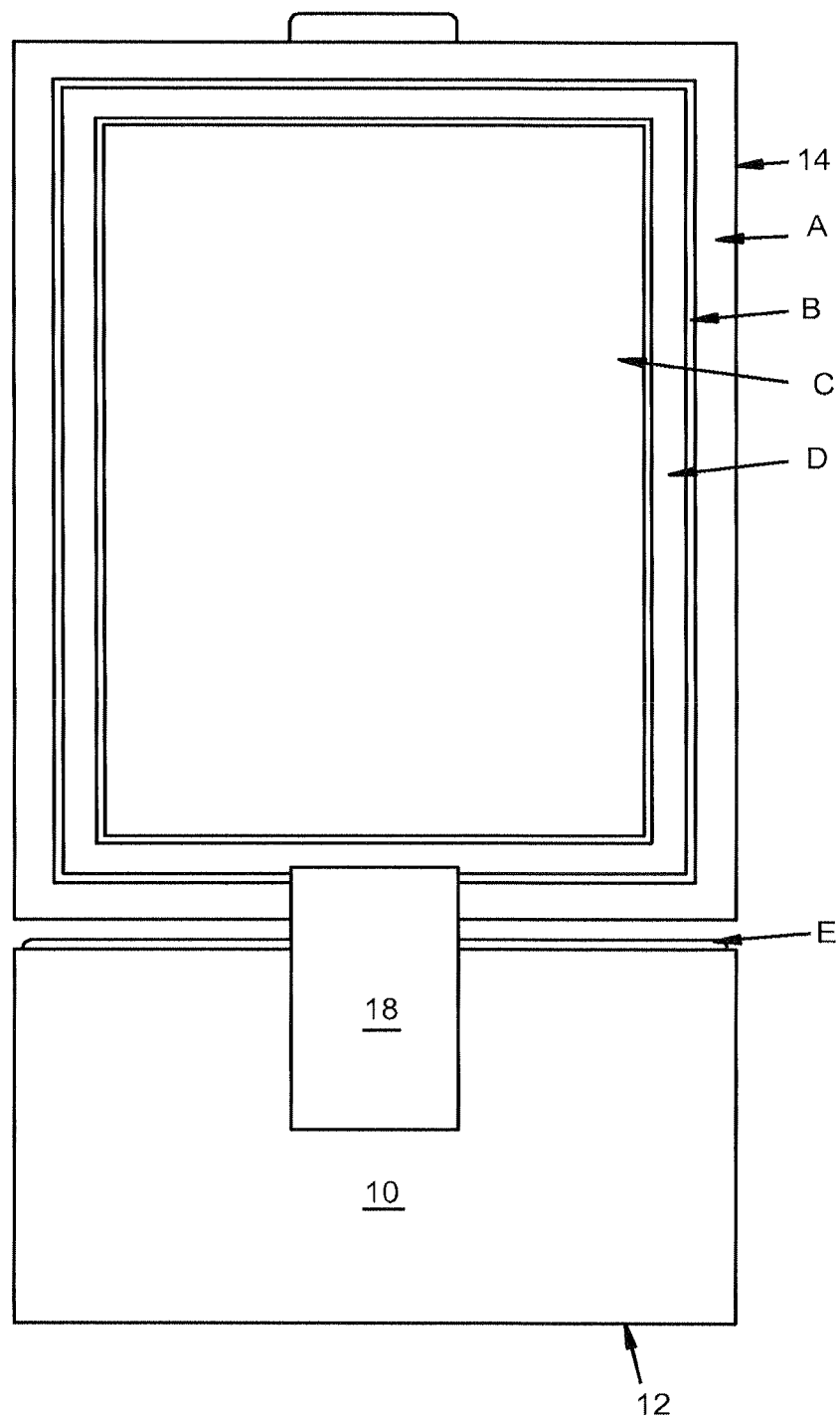
FIG. 1 is a plan view of the front of an exemplary illustrative non-limiting chamber showing the interior of the lid and body of the chamber in the open position.

Referring to FIGS. 1-11B, there is shown an exemplary illustrative non-limiting electromagnetic isolation chamber 10 in the form of a rectangular box having a base portion 12 and a top portion 14 which are hingeably connected by hinges 16 to permit opening of the chamber 10 to admit, for example, a device or devices to be isolated. Latches 18 secure the top to the base when the chamber is in the closed position to obtain a volume of space protected from sound and electro-magnetically isolated from the environment surrounding the chamber.

In an exemplary illustrative non-limiting implementation, both top 14 and the base 12 are made from a three part layered wall construction (layered wall) consisting of:

A. A continuous layer of protective sound reducing material such as for example polyethylene plastic and foam, Neoprene Rubber, Neoprene, sound absorbing foam or any of the such, B. A layer of conductive material, for example, sheet metal, metal foil, metallized plastic, metal-plastic laminate, or metal screening having openings smaller than a fractional wavelength of the radiation to be shielded; 25 MHz-8000 MHz C. A internal layer of Radio Frequency Absorbing Foam (RFAF) directed towards the interior of the chamber.

The conductive layer (B) of the top and base are conductively connected when the top and base are in the closed position, connecting with a shielding gasket (D) known in the art. In addition, the top and base are connected with a continuous rubber gasket (E) used to reduce the introduction of ambient sound and light into the chamber at the chamber opening.

Figure 2:
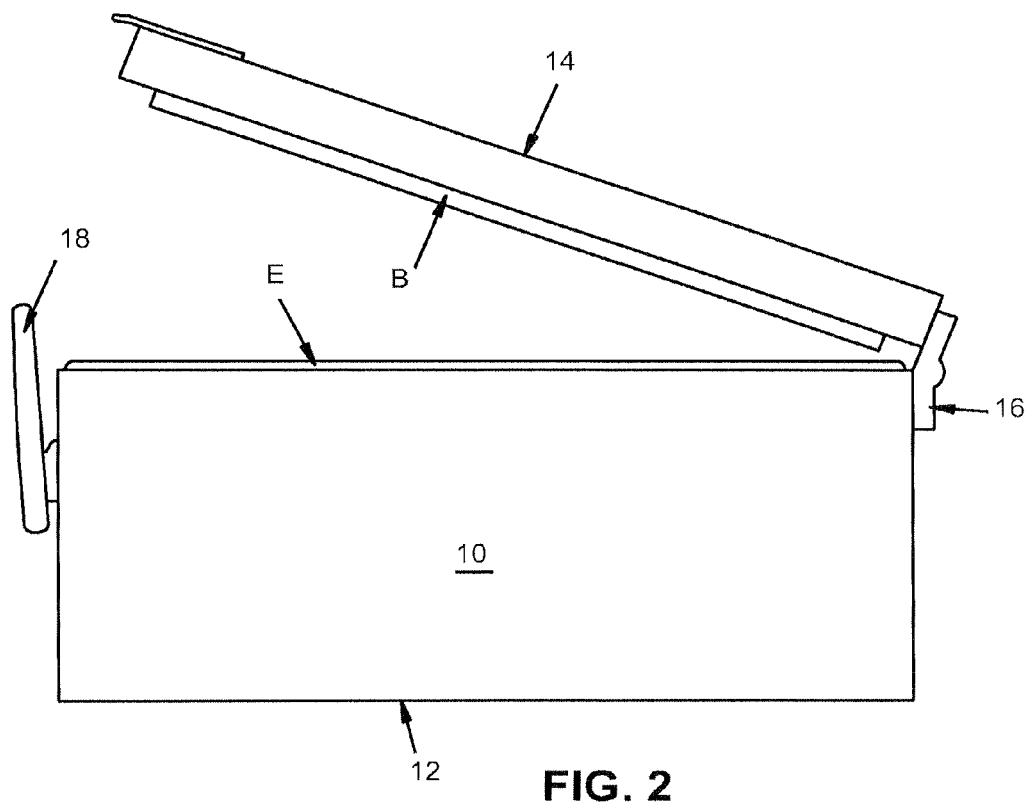
FIG. 2 is a plan view of the side of the exemplary illustrative non-limiting isolation chamber with the lid in the open position showing the Latch (18), the hinges (16) and the sound gasket (E)
Figure 3:
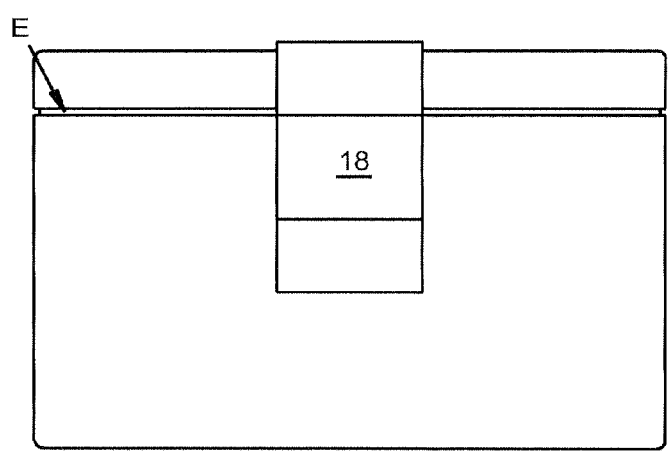
FIG. 3 is a plan view of the front of the exemplary illustrative non-limiting isolation chamber showing the latch (18) and the sound gasket (E)
Figure 4:
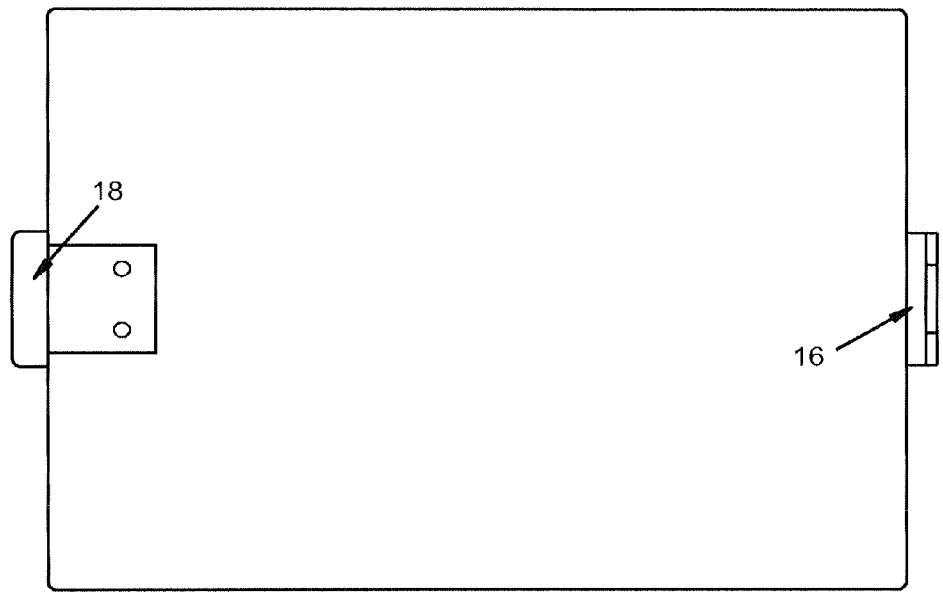
FIG. 4 is a plan view of the top of the exemplary illustrative non-limiting isolation chamber showing the hinges (16) and the latch (18)
Figure 5:
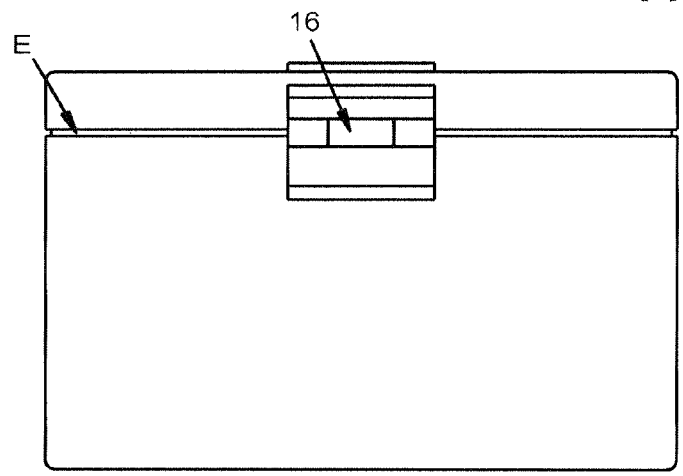
FIG. 5 is a plan view of the rear of the exemplary illustrative non-limiting isolation chamber showing the hinges (16) and the sound gasket (E)
Figure 6:
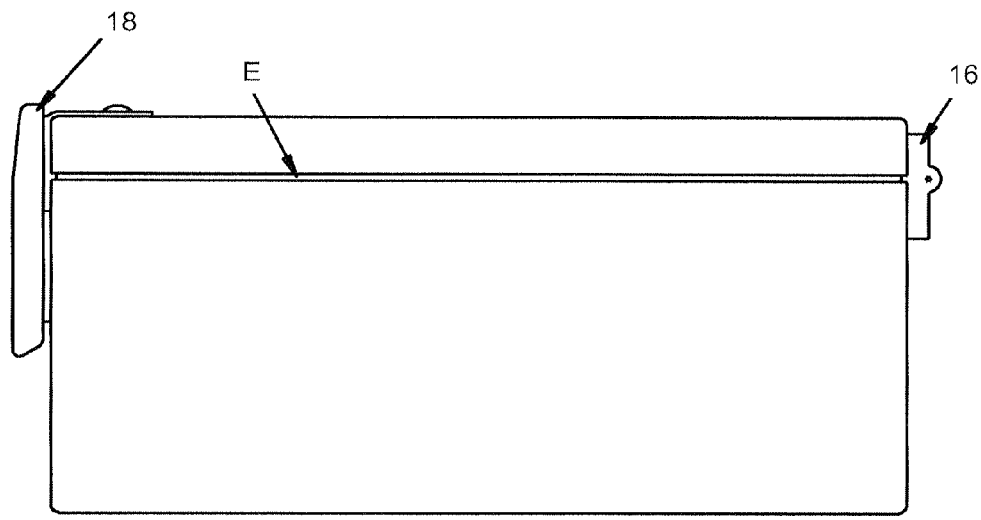
FIG. 6 is a plan view of the right side of the exemplary illustrative non-limiting isolation chamber showing the Hinges (16), the Latch (18) and the sound gasket (E)
Figure 7:
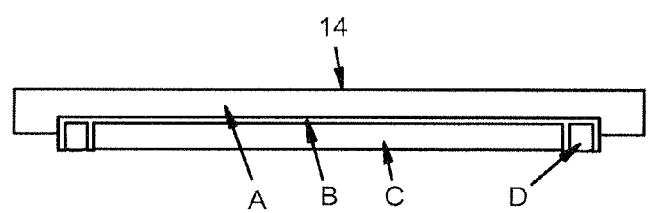
FIG. 7 is a plan cross-section view of the exemplary illustrative non-limiting isolation chamber from the front showing the top portion 14 separated from the Base portion 12 (the cross section view shows the different layers of the exemplary illustrative chamber as well as the other components of the chamber)
Figure 7:
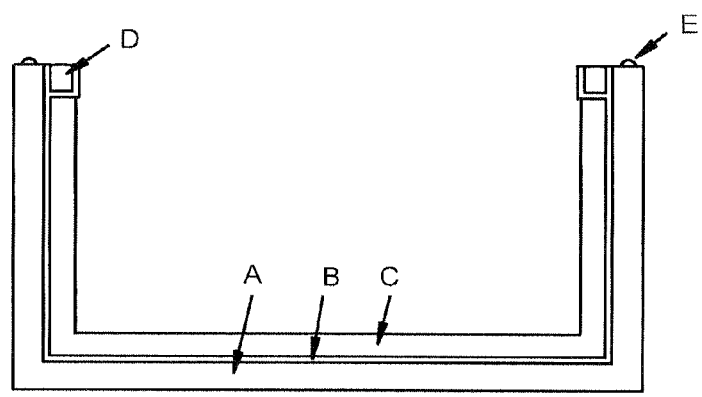
Figure 8:
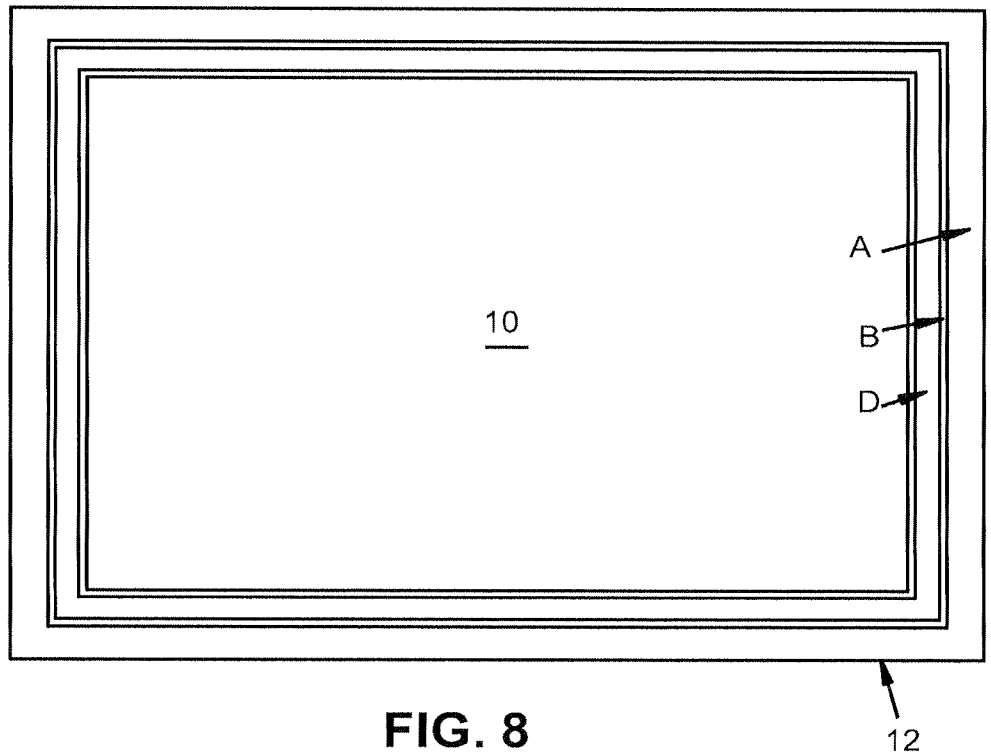
FIG. 8 is a plan view of the base portion of the exemplary illustrative non-limiting chamber (10) from the top showing the layered wall and the Radio frequency shielding gasket (D)
Figure 9:
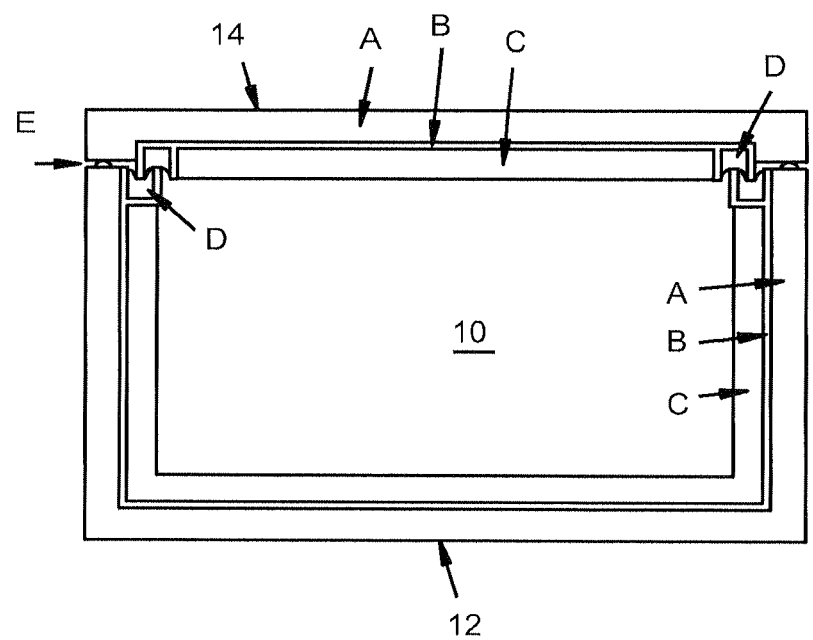
FIG. 9 is a plan cross section view of the exemplary illustrative non-limiting chamber (10) from the front with the base portion (12) connected to the top portion (14) showing the Radio Frequency gaskets (D) forming a continuous connection between the base portion (12) and the top portions (14) conductive layers (B), the view also shows the sound gasket (E) forming a continuous connection between the base portion (12) and the top portions (14) connecting the sound reducing layer (A)
Figure 10:
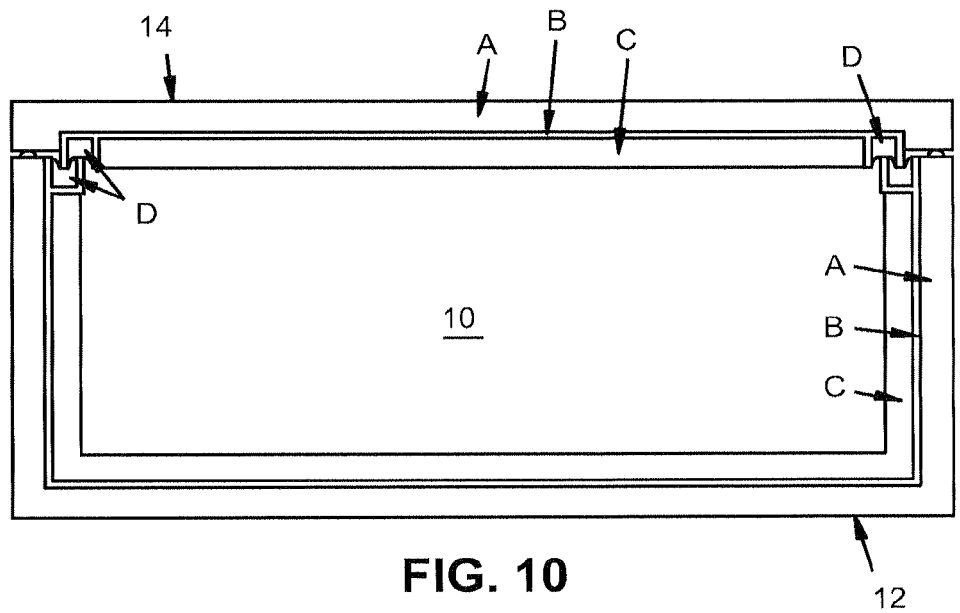
FIG. 10 is a plan cross section view of the exemplary illustrative non-limiting chamber (10) from the side with the base portion (12) connected to the top portion (14) showing the Radio Frequency gaskets (D) forming a continuous connection between the base portion (12) and the top portions (14) at the conductive layers (B), the view also shows the sound gasket (E) forming a continuous connection between the base portion (12) and the top portions (14) connecting the sound reducing layer (A)
Figure 11A:
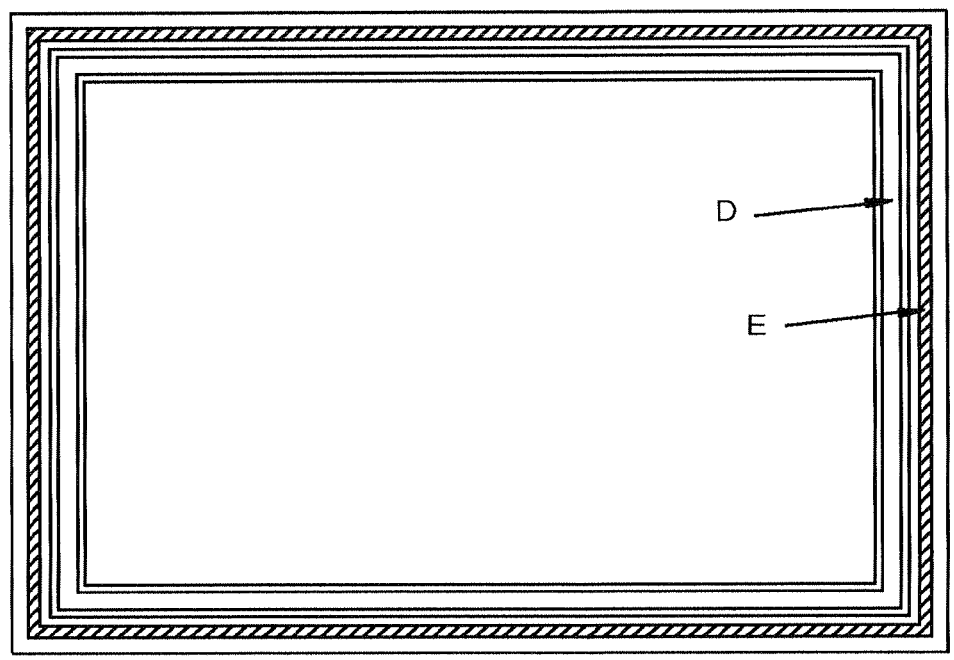
FIGS. 11A-11B are plan and side views of the base from the top showing the exemplary illustrative non-limiting placement of the Radio Frequency gasket (D) and the sound reducing gasket (E) on the rim of the chamber opening.
Figure 11B:
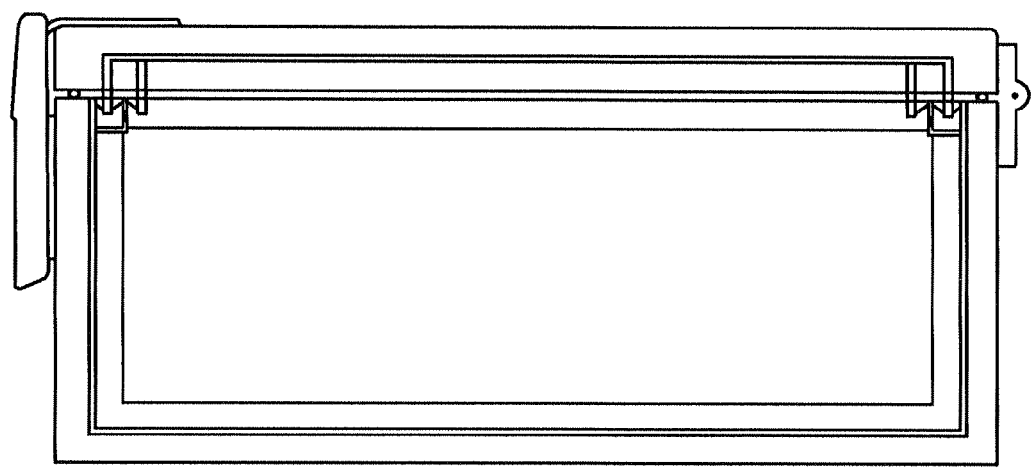

In more detail, FIG. 1 shows a front view of an exemplary illustrative implementation of an electromagnetic isolation chamber 10 having hingeable top portion or lid 14 open wide, and FIG. 2 shows the same isolation chamber 10 with the lid 14 only partially open. In use, the electromagnetic device to be isolated is placed inside of base portion 12 (which is hollow) and lid 14 is closed and latched with latch 18. When lid 14 is closed as shown in FIGS. 3-6, and latch 18 is latched to firmly seal and retain lid 14 to bottom portion 12, no electromagnetic energy emitted from a device placed within base portion 12 can escape and similarly electromagnetic energy external to the isolation chamber 10 is unable to reach the device within the chamber. For example, if the electromagnetic device placed within chamber 10 is a cellular telephone, the cellular telephone will not receive any signal no matter how close the chamber 10 may be to a cellular repeater or other station, and similarly, the cellular telephone will not be able to send any signals that could be received by a device that is external to the isolation chamber 10. In use, for security or other purposes, it may be desirable for all passengers of a vehicle to place their cellular telephones, blackberries, pocket digital assistants, and any and all other electronic devices they may be carrying into isolation chamber 10. Isolation chamber 10 is then sealed and placed in a position in the vehicle where the passengers cannot access it. This is a way of enforcing "radio silence" to prevent any passengers within the vehicle from communicating their location either intentionally or unintentionally (e.g., by permitting a cellular telephone to send permission updates to local cell phone towers). An added feature of an exemplary illustrative non-limiting implementation is that the electronic devices placed within isolation chamber 10 are also isolated with respect to both sound and light (i.e., all or substantially all wave lengths of electromagnetic radiation and other waves for example from 20 Hz to light frequencies across the entire radio spectrum).

Figure 12B:
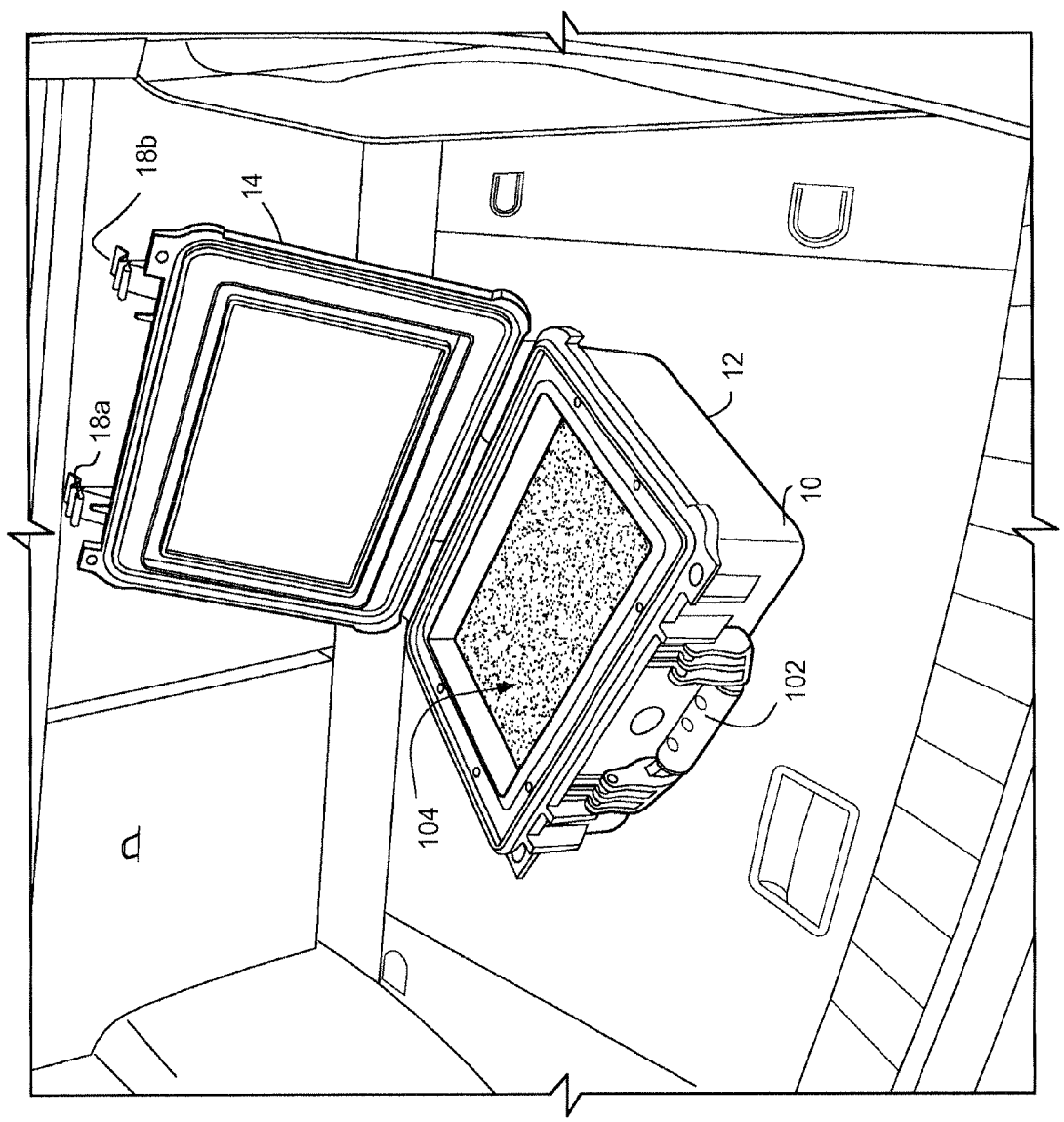
Figure 12C:
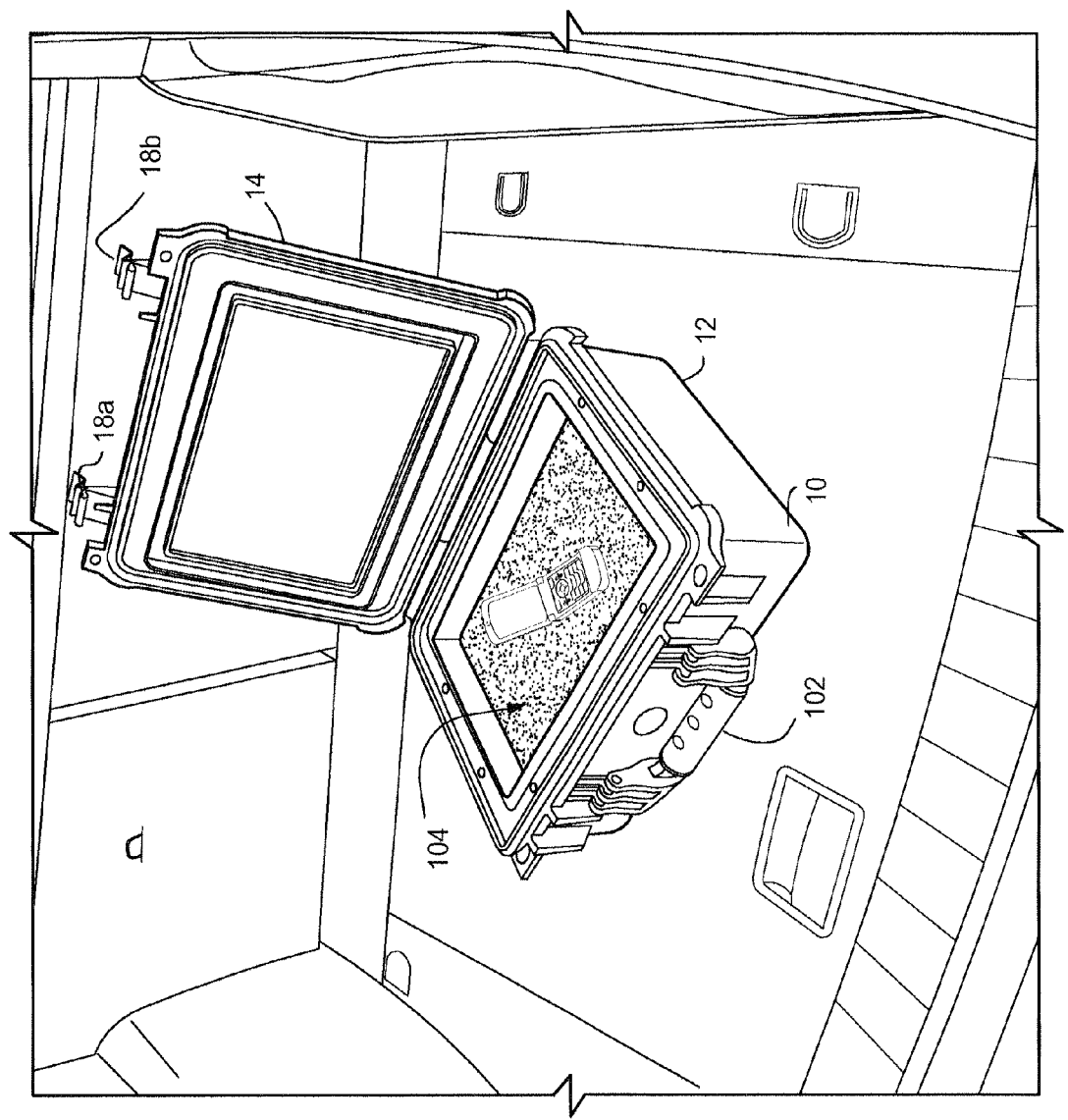

FIGS. 12A-12C show one exemplary illustrative non-limiting implementation of an isolation chamber 10 disposed within the back of a vehicle 100. Isolation chamber 10 as shown in FIG. 12A is closed and as a suitcase or attaché case form factor. Chamber 10 includes a handle 102 for easy lifting and transportation. This handle 102 is conventional and of a type that might be found on a suitcase or briefcase. In the exemplary illustrative non-limiting implementation shown in FIG. 12A, a pair of latches 18a, 18b are used to latch the top portion or lid 14 to the bottom or base portion 12 when the chamber is sealed. As shown in FIG. 12B, the latches 18 may be opened and lid 14 lifted upwards to expose an internal chamber 104 into which one or a number of electronic devices such as cell phones may be placed (see FIG. 12C). The sealing structure and wall structure of the implementation shown in FIGS. 12A-12C may be as shown and described in connection with FIGS. 1-11B.

Figure 13A:
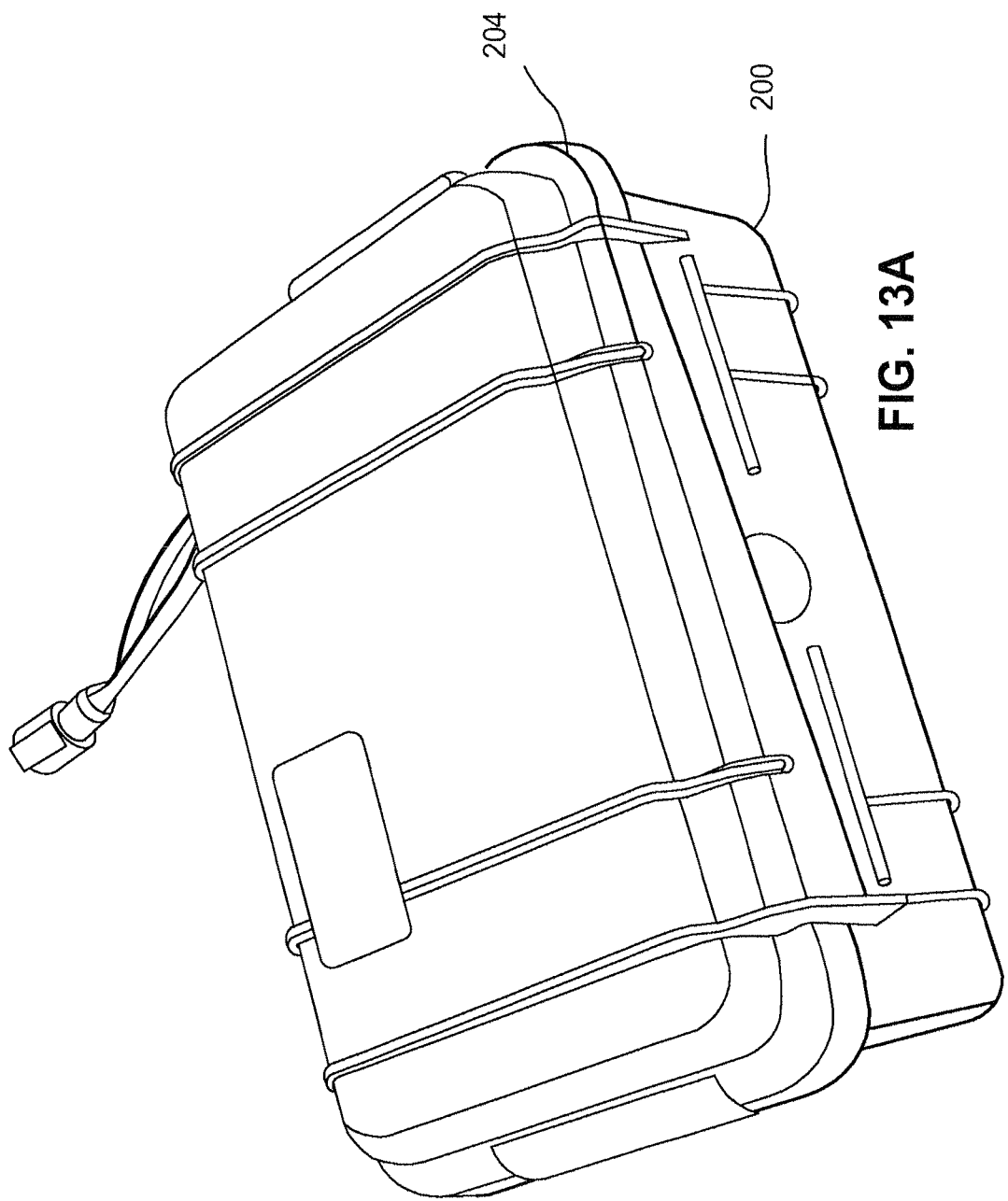
FIGS. 13A-13C show a further exemplary isolation chamber implementation providing a larger suitcase form factor.
Figure 13B:
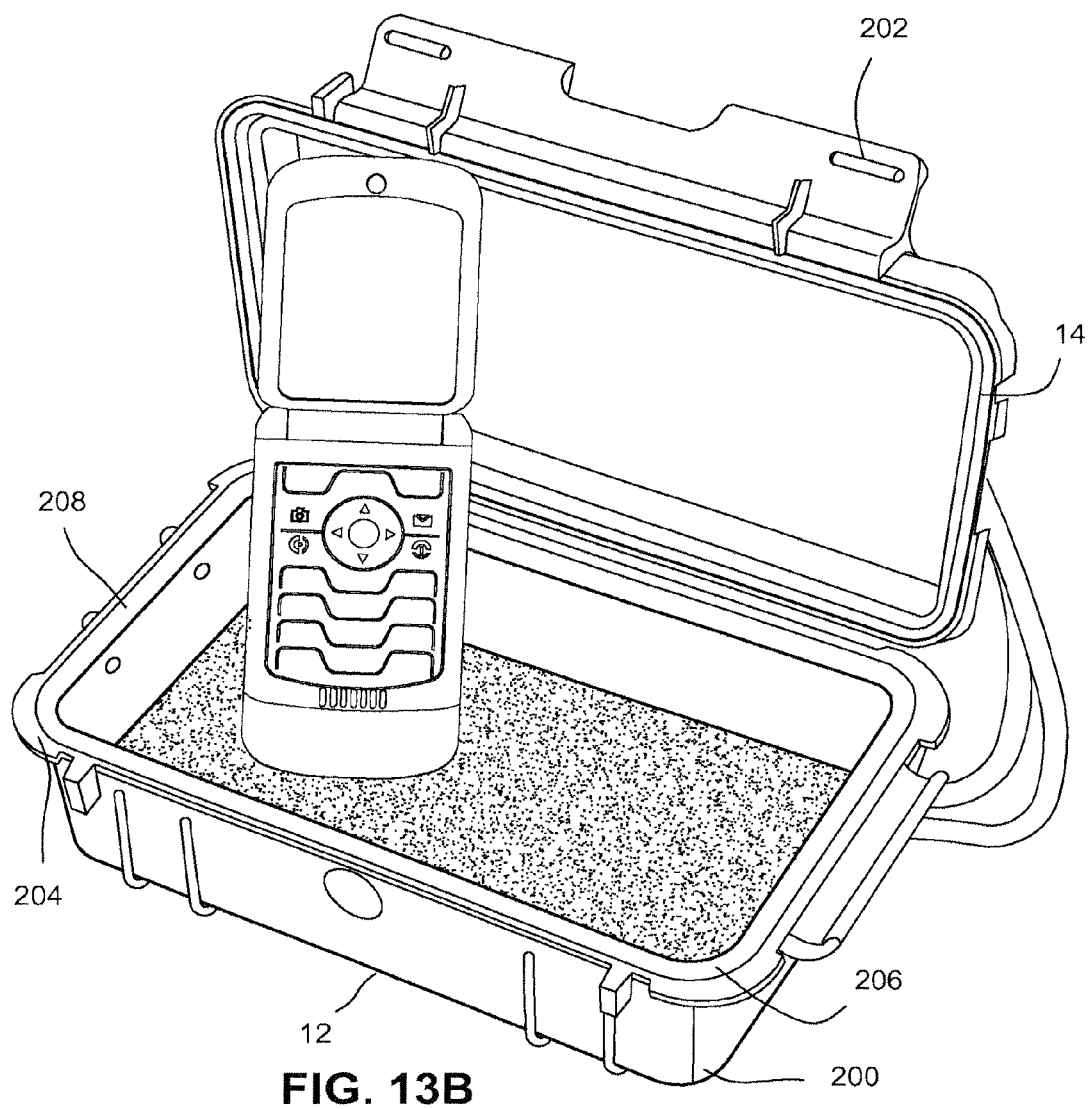
Figure 13C:
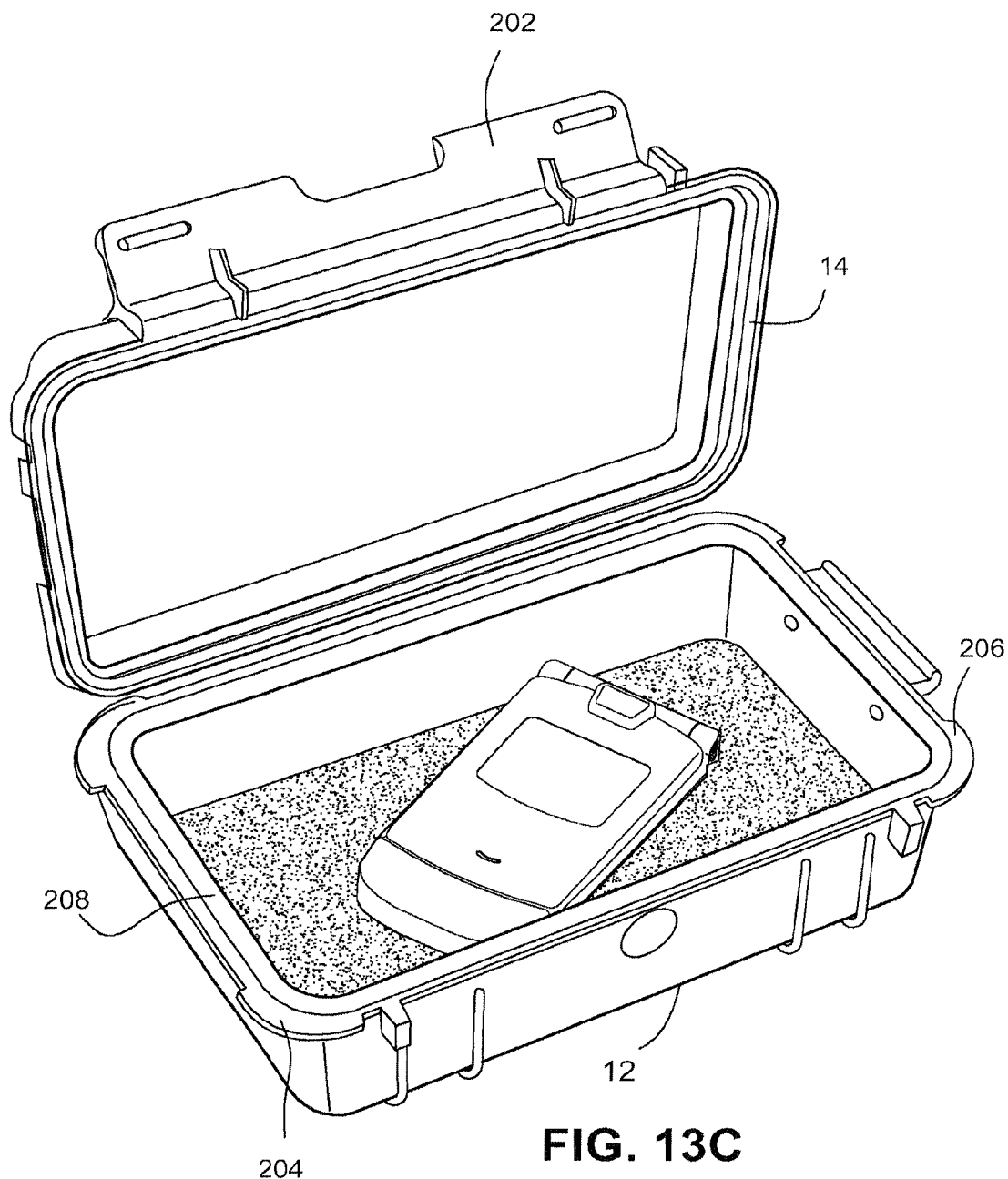

FIGS. 13A-13C show another exemplary illustrative non-limiting implementation using a slightly different form factor that is more compact and light-weight. As shown in FIG. 13A and FIG. 13B, another exemplary illustrative non-limiting implementation of an isolation chamber 200 may once again include a top portion 14 and a bottom portion 12. In this example implementation, the top portion 14 includes a single long (longitudinally extending) latch 202 that mates with and latches with respect to an outer lip 204 that extends from the periphery of bottom portion 12. The FIG. 13A-FIG. 13C implementation of isolation chamber 200 may be constructed of aluminum or other electrically conductive metal. A gasket 206 surrounding the bottom portion lip 208 may seal the bottom portion 12 to top portion 14 when latch 202 is closed (as shown in FIG. 13A) and isolation is desired. The dimensions of the FIG. 13A-13C implementation may be as desired, but as shown in FIG. 13C the dimensions should be chosen (i.e., height, width and depth) to be large enough to contain one or several electronic devices such as cell phones of conventional size.

Figure 14A:
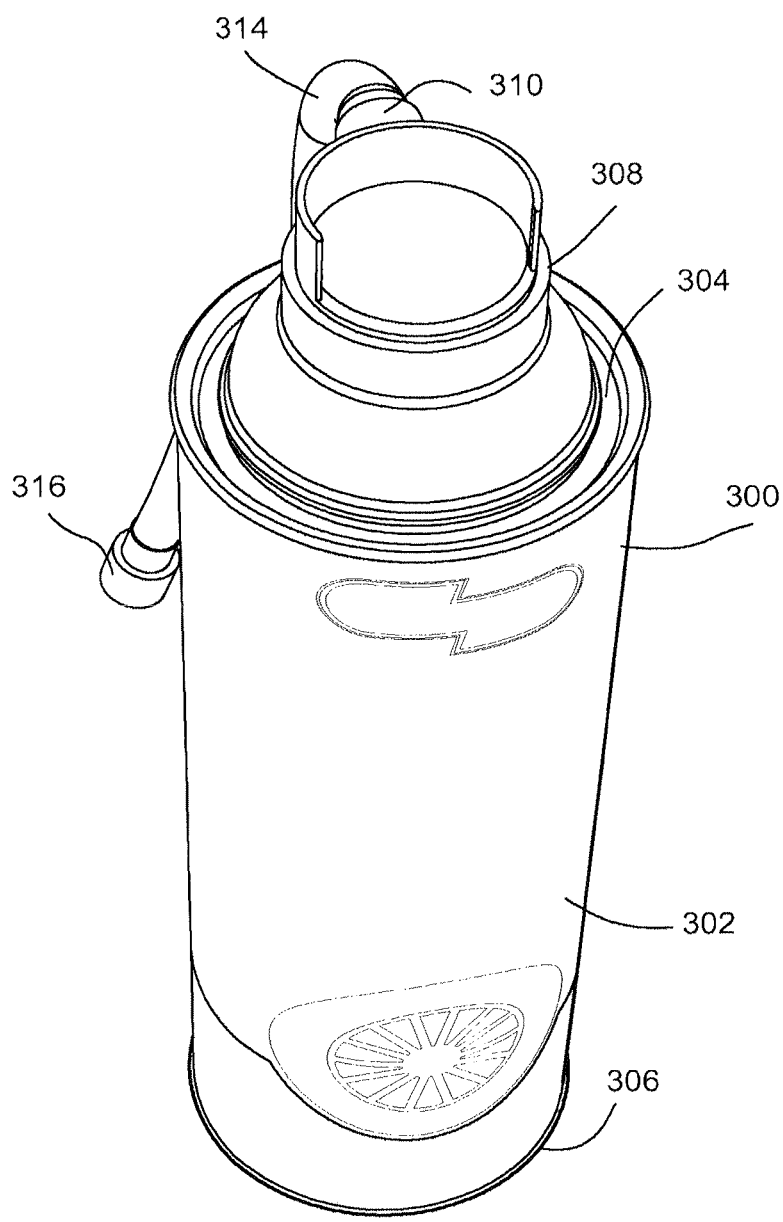
FIGS. 14A-14D show yet another exemplary isolation chamber implementation providing a disguised aerosol can form factor.
Figure 14B:
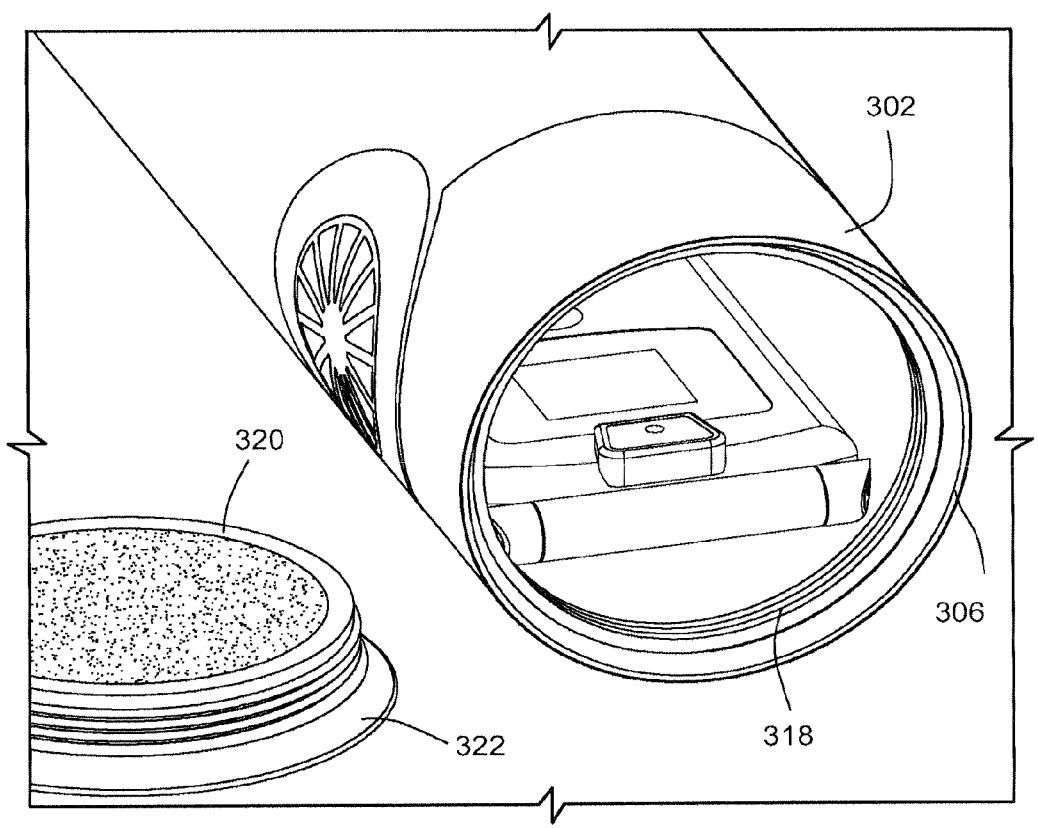
Figure 14C:
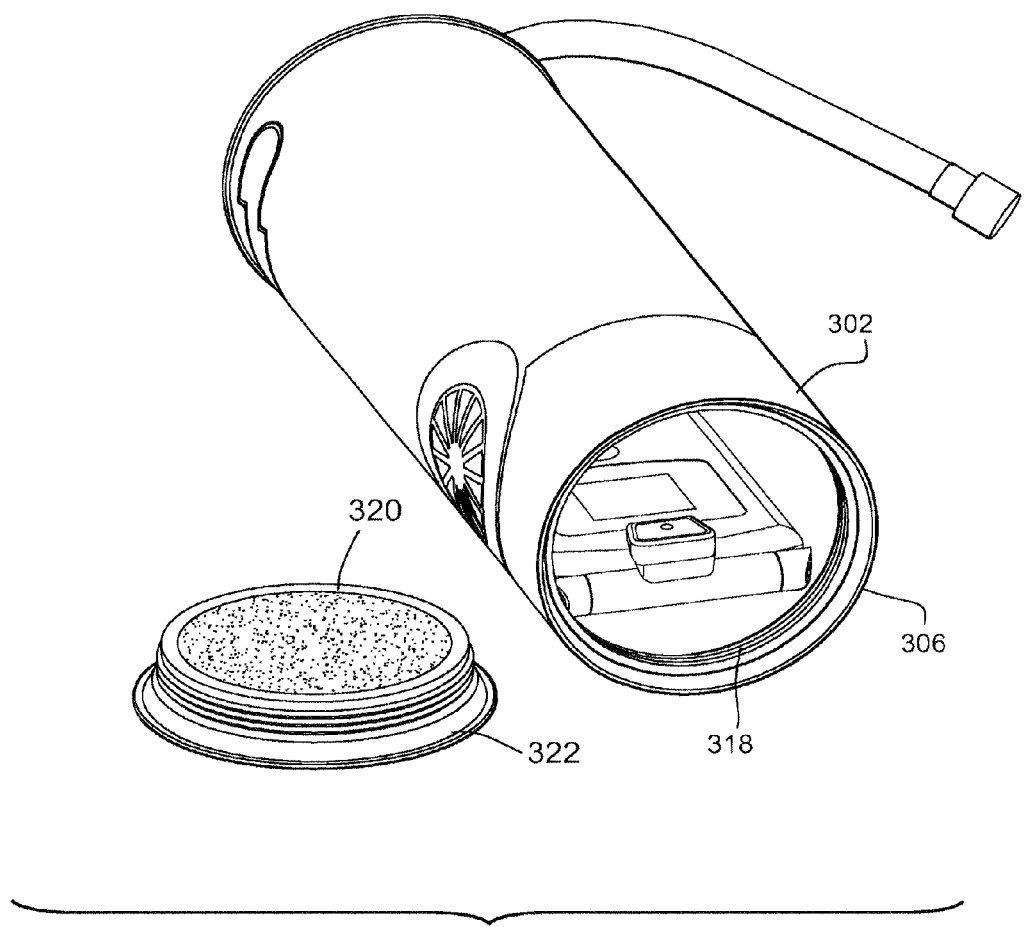
Figure 14D:
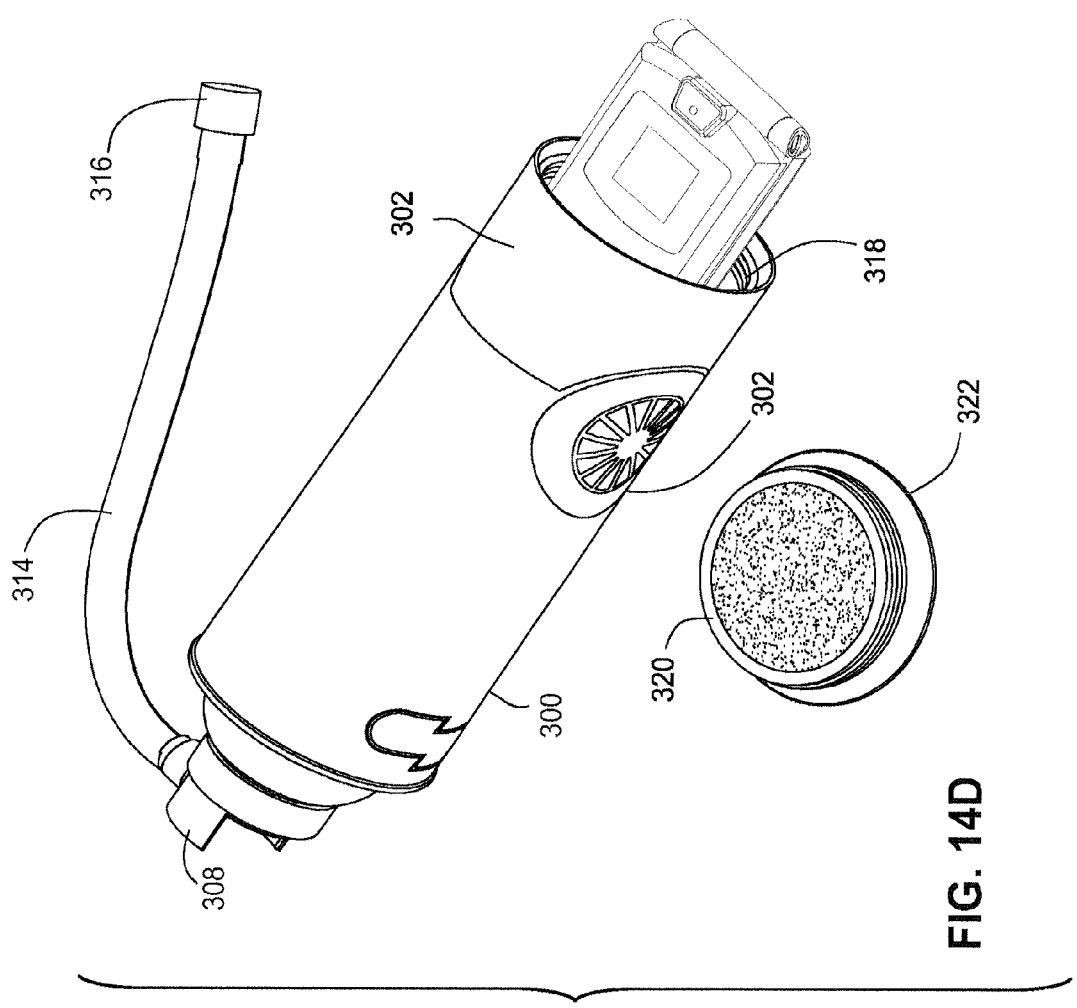

The isolation chamber may be of any desired size, shape and form factor. In some instances, it may be desirable to provide an isolation chamber that is disguised as or can masquerade as some other object that would be commonly found within a vehicle or other environment. The implementation shown in FIGS. 14A-14D provides a form factor of a conventional aerosol can containing pressurized air used to inflate a tire. As shown in FIG. 14A, isolation chamber 300 may comprise a cylindrical can-like structure 302 including a top 304 and a bottom 306. The top 304 may include for example a conventional cap 308 which in this case provides a nozzle 310 out of which extends an air hose 314 which terminates in a mating tire valve attachment 316. From outside appearances, isolation chamber 300 looks to be a tire inflation aerosol can. However, as shown in FIGS. 14B-14D, the bottom 306 is actually a false bottom and includes a threaded portion 318 designed to accept a mating threaded portion 320 of a metallic disk 322. As shown in FIG. 14B, can 302 is not necessarily a conventionally thin tin can but may be a machined steel or other conductive material container dimensioned to accept a cellular telephone or other electromagnetic radiating device. Once the cellular telephone is placed within the chamber inside of cylindrical wall 302, the bottom plate 322 may be threadably engaged using threads 318, 320 and turned for example clockwise to seal the electronic device within the chamber. When the device is sealed within the chamber, it can no longer radiate electromagnetic signals nor can it receive electromagnetic signals. The implementation shown in FIGS. 14A-14D may be especially advantageous in instances where it is desirable to conceal, both physically and electromagnetically, the existence of an electronic device such as a cellular telephone from detection.

From the forgoing description it will be apparent that there has been provided improved electromagnetic isolation chamber, wherein a device or multiple devices can be isolated from transmitting and or receiving, isolated for certain levels of sound, isolated from certain levels of ambient light in order to provide security and privacy, device that will not allow communication ingress or egress to these devices while they are properly enclosed within the chamber while remaining mobile and ungrounded.

While the technology herein has been described in connection with exemplary illustrative non-limiting implementations, the invention is not to be limited by the disclosure. The invention is intended to be defined by the claims and to cover all corresponding and equivalent arrangements whether or not specifically disclosed herein.

I claim:

1. An electromagnetic isolation chamber containing a volume of space electro-magnetically isolated from the surrounding environment, comprising:
 a) a wall enclosing said volume, said wall having first ungrounded electromagnetic shielding surrounding said volume,
 b) a sound reducing shielding disposed within said chamber or exposed externally from said chamber, the sound reducing shielding configured to substantially prevent sound from a source outside of said volume from entering said volume; and
 c) a lining consisting of Radio Frequency Absorbing Foam disposed within said chamber covering the sides of said volume in a manner and proportion to best optimize the abilities of radio frequency absorbing being utilized, including but not limited to directing the effective portion of the Radio Frequency Absorbing Foam towards the inside of the chamber.

2. A chamber in accordance with claim 1 wherein said wall comprises a plurality of sides defining a box.

3. A chamber in accordance with claim 2 wherein said box is openable and has a top portion and a base portion.

4. A chamber in accordance with claim 3 wherein said top portion is conductively attached to said base portion when closed.

5. A chamber in accordance with claim 4 wherein said top portion is attached by an attachment which comprises a lid hinged from the body and securable by a latch or accessible or by other methods such as sliding lids, magnetic lids, swing out lids and the such.

6. A chamber in accordance with claim 5 further comprising a shielding gasket between said top portions.

7. An electromagnetic isolation apparatus to isolate at least one electronic communication device of the type having an audio input that receive sounds, the at least one electronic communication device having electromagnetic transmission capabilities that wirelessly transmit signals, the apparatus comprising:
 an ungrounded housing having a form factor dimensioned to fit into a vehicle, the ungrounded housing having an openable portion and a base portion,
 said housing comprising:
  a conductive layer that substantially prevents electromagnetic radiation from passing therethrough, said housing defining a cavity within the base portion, said openable portion having a first position that allows the at least one electronic communication device to be placed within and enclosed by said cavity, the openable portion including a second position that seals said cavity such that wireless transmissions from the at least one electronic communication device are substantially prevented from passing between said cavity and the outside world,
  a sound-reducing shield configured to acoustically decouple the cavity from sound outside of the cavity so that the housing, in use, prevents the audio input of said at least one electronic communication device from picking up sound originating from outside of the cavity when said at least one electronic communication device is disposed within the cavity with the openable portion set in the second position, and
  an electromagnetic radiation absorbing layer that is configured to absorb at least some wireless transmission energy to/from the at least one electronic communication device,
 wherein the openable portion and the base portion each include the electromagnetic radiation absorbing layer, the conductive layer, and the sound-reducing shield,
 wherein the ungrounded housing further includes a sealing structure that conductively connects the conductive layer of the openable portion to the conductive layer of the base portion when the openable portion is in the closed position.

8. The apparatus of claim 7, wherein said form factor comprises a form factor of a device used to repair a vehicle.

9. The apparatus of claim 7, wherein said form factor comprises a handheld structure typically used for a purpose having nothing to do with electromagnetic isolation.

10. The apparatus of claim 7, wherein the openable portion includes a removable cap that is threaded.

11. The apparatus of claim 7, wherein said housing is dimensioned such that said cavity is large enough to accommodate at least one cellular telephone or other electronic communication device.

12. The apparatus of claim 7, wherein the electromagnetic radiation absorbing layer includes an absorbing foam that is disposed between the cavity and the conductive layer and the sound-reducing shield.

13. The apparatus of claim 7, wherein the sound-reducing shield further includes a sound reducing foam.

14. The apparatus of claim 7, wherein the ungrounded housing further includes sound reducing structure that communicably connects the sound-reducing shield of the openable portion to the sound-reducing shield of the base portion when the openable portion is in the closed position.

15. An electromagnetic and sound isolation container for isolating at least one communication device of the type having an audio input that receive sounds, the at least one electronic communication device having electromagnetic transmission capabilities for wirelessly transmitting signals, the container comprising:
- a first portion defining an electronic communication device holding cavity;
- a second portion moveable between at least an open position and a closed position,
    - in the open position, the second portion allowing the at least one electronic communication device to be placed into the electronic communication device holding cavity, and
    - in the closed position, the top portion closing off the electronic communication device holding cavity such that wireless transmissions and audio input/output to/from the at least one electronic communication device placed within the electronic communication device holding cavity are substantially prevented from passing into or out of said electronic communication device holding cavity;
- a sound reduction layer included in the first and/or second portions that, in use, acoustically isolates the audio input of the at least one communication device from picking up sound originating outside the electronic communication device holding cavity when the second portion is in the closed position;
- a conductive electromagnetic shielding layer that is included in the first and/or second portions, wherein the conductive electromagnetic shielding layer substantially prevents electromagnetic radiation from passing into or out from the electronic communication device holding cavity when the top portion is in the closed position; and
- an electromagnetic and acoustical sealing gasket arrangement that conductively connects the top and bottom portions and acoustically seals the first portion to the second portion to thereby reduce the introduction of sound into the electronic communication device holding via an opening that is closed when the second portion is in the closed position, wherein the apparatus has a form factor that is dimensioned to fit into a vehicle.

16. The container of claim 15, further comprising a radio frequency absorbing layer that is included in the first and second portion and that is configured to absorb at least some wireless transmission energy from the at least one electronic communication device placed within the electronic communication device holding cavity.

17. The container of claim 16, wherein the layers are positioned in the following order in a direction oriented from the electronic communication device holding cavity to an area outside the apparatus,
- the radio frequency absorbing layer,
- the conductive electromagnetic shielding layer, and
- the sound reduction layer.

18. The container of claim 15, wherein the electromagnetic and acoustical sealing gasket arrangement includes a first conductive part that is disposed on/in the second portion and a second conductive that is disposed on/in the first portion.

19. The container of claim 18, wherein, in the closed position, the first conduction part and the second conductive part are offset from one another.

20. The container of claim 15, wherein the electromagnetic and acoustical sealing gasket arrangement includes:
- a shielding gasket that conductively connects the first portion to the second portion when the second portion is in the closed position;
- a sound sealing gasket that acoustically seals the first portion to the second portion when the second portion is in the closed position.

* * * * *